United States Patent [19]

Paiva

[11] Patent Number: 5,140,607
[45] Date of Patent: Aug. 18, 1992

[54] SIDE-PUMPED LASER WITH ANGLED DIODE PUMPS

[75] Inventor: Richard A. Paiva, Overland Park, Kans.

[73] Assignee: Laser Diode, Inc., New Brunswick, N.J.

[21] Appl. No.: 704,802

[22] Filed: May 23, 1991

[51] Int. Cl.[5] ............... H01S 3/091; H01S 3/092
[52] U.S. Cl. ............................................. 372/70
[58] Field of Search ................. 372/39, 40, 41, 70, 372/71, 72

[56] References Cited

U.S. PATENT DOCUMENTS

| | | | |
|---|---|---|---|
| 4,945,544 | 7/1990 | Tanaka et al. | 372/70 |
| 4,962,505 | 10/1990 | Mochizuki et al. | 372/70 |
| 4,969,155 | 11/1990 | Kahan | 372/70 |
| 5,033,058 | 7/1991 | Cabaret et al. | 372/70 |
| 5,048,044 | 9/1991 | Ireland | 372/70 |

Primary Examiner—John D. Lee
Assistant Examiner—Robert E. Wise
Attorney, Agent, or Firm—Haverstock, Garrett and Roberts

[57] ABSTRACT

The present invention relates to a laser device and particularly a laser device having an elongated laser medium with a sidewall and an axis and capable when stimulated of having a population inversion established therein and an accompanying lasing condition, and a pair of pump sources at angle with respect to each other relative to the axis of the medium and positioned to pump energy uninterruptedly into the sides of the medium thereat. In the present construction the pump sources are rows of diode lasers and the construction includes an apparatus for dissipating the heat generated in the pump sources and in the medium. The angular orientation between the pump sources relative to the axis of the medium can vary from an acute angle to an obtuse angle and the device can have a reflective layer positioned on or adjacent to the medium at locations on the opposite side of the medium from the respective pump sources.

49 Claims, 5 Drawing Sheets

SIDE-PUMPED LASER WITH ANGLED DIODE PUMPS

FIELD OF THE INVENTION

This invention pertains to the field of diode-pumped lasers which use side-mounted laser diodes to excite a laser medium.

BACKGROUND OF THE INVENTION

Diode pumped lasers involve semiconductor diodes which lase when excited by electrical current. The lasing portions of the semiconductors (usually PN junctions) are positioned near a laser medium (such as a crystal) so that laser energy from the semiconductor diodes is directed into the medium, either directly or via lenses When "pumped" by the laser energy from the diodes, the energy excitation levels (sometimes referred to as population inversions) build up within the atomic structure of the medium and cause the medium to lase. The medium, which is usually elongated and provided with a mirror or a reflective coating at each end, focuses the laser energy along the main axis of the medium. The laser beam exits through an opening in one of the mirrors, or through a portion of one of the mirrors that is partially transparent.

The lasing diode(s) used to excite or "pump" a laser medium can be mounted at one end of the medium, to create an end-pumped laser, or along the side of the medium, to create a side-pumped laser. End-pumped lasers are limited in power since only one diode or a small number of diodes can be mounted in close proximity to the end of a medium. Side-pumped lasers can be more powerful, since many diodes can be mounted along the length of the medium. For more information on diode-pumped lasers, see, e g., W. Koechner, *Solid State Laser Engineering* (Springer-Verlag, New York, 1988) and the article by G. T. Forrest in *Laser Focus Electro-Optics*, Nov. 1987, pp. 62-74.

Laser diodes generate substantial amounts of heat and therefore must be cooled if they are to produce substantial outputs If not properly cooled, high temperatures (i.e., increased vibrations of the atomic lattices in the semiconductor material) can interfere with current flow through the semiconductor material, and can damage or destroy the diodes. The laser medium is also subjected to high heat and must be cooled, for comparable reasons High temperatures can also warp the mounting devices, causing the diodes and medium to become misaligned.

The magnitude and importance of the cooling problem can be seen in perspective by considering the efficiencies of diode-pumped lasers. Efficiency is measured by dividing the amount of power carried in the laser beam (expressed in units or watts) by the total wattage consumed by the laser equipment. For a typical side-pumped laser to generate a laser beam carrying one watt of energy, it must dissipate as much as 100 watts of input energy, most of which must be dissipated as heat. Many lasers which cannot otherwise cope adequately with the problem of cooling must be operated only in a pulsed mode; i.e., their output is limited to short bursts of laser energy. Between pulses, such lasers must be deactivated so they can cool. However, it is often desirable to operate lasers in the continuous wave (CW) mode.

Various devices have been developed in the prior art for dissipating the heat generated by diode-pumped lasers. Conventional heat sinks which serve an entire laser head (the assembly which includes the active lasing elements and the mounting components for those active elements) are shown in FIGS. 1 and 4 of U.S. Pat. No. 4,805,177 (Martin et al 1989; assigned to the Applicant's assignee, Laser Diode, Inc.). Such heat sinks usually have fins to increase their surface area. They can be positioned near fans that blow air across the fins, or cooled by pumping cooling water or other liquids across their surfaces or through channels that pass through the heat sinks. Such heat sinks are referred to herein as "system heat sinks," since they serve an entire laser head system. That term distinguishes them from diode heat sinks or medium heat sinks, which interact directly with only the indicated components. Typically, any diode heat sinks and medium heat sinks in a laser head are thermally coupled to a single large system heat sink.

A diode configuration which offers improved heat control is shown in U.S. Pat. No. 4,864,584 which is also assigned to applicant's assignee. That patent discloses a structure with arrays of numerous very small diodes which are closely packed together. Briefly, a semiconductor wafer having a diameter of about 5 cm is generated with hundreds of parallel "laser stripes" consisting of small lines where the doping of the semiconductor material is altered. The laser stripes are arranged in arrays or clusters, such as clusters of four stripes separated by small gaps having no stripes. The wafer is coated with a layer of gold, then it is cleaved by nicking the crystalline material in the gaps between each cluster of four stripes and breaking the crystal along the lines of the nicked material. This creates elongated pieces of material, each piece having four laser stripes running lengthwise. Each piece is then nicked a second time in a direction perpendicular to the laser stripes, then it is broken to form numerous small chips, each chip being roughly one millimeter wide and having four laser stripes that are electrically coupled to the layer of gold. Each chip is referred to as a "laser diode array." A single conductive lead is soldered to the layer of gold on each laser diode array. When the laser diode array is excited by applying a voltage thereacross and passing an electrical current through it, each of the four laser stripes functions as a laser diode pump source.

Each laser diode array is mounted on a diode heat sink, which comprises a small piece of copper or other suitable heat-conducting metal. Numerous diode arrays and their heat sinks are placed next to each other and mounted on a larger diode mount, also made of heat-conductive metal. In that arrangement, the heat generated by the numerous small diodes is distributed more evenly than the heat generated by the larger diodes used in the prior art. Since the heat is distributed more evenly across the diode mount, hot spots (which can adversely effect operation) are minimized.

U.S. Pat. No. 4,864,584 also discloses the use of two rows of diode array pump sources, arranged in opposed relation, one row on each side of a laser medium (see FIGS. 4, 9, and 10 of that patent). By doubling the number of diode arrays, the medium can be pumped more intensively and will produce a higher output. However, such a configuration requires correspondingly greater means for removing heat from the diodes and medium.

There remains a never-ending need for improved methods of removing the heat from the immediate vicinity of the diode pump sources and mediums in diode-pumped lasers, especially in side-pumped lasers, which can involve large numbers of diodes. There is also a constant need for other methods of increasing the power and/or efficiency of side-pumped lasers. Any device or arrangement which makes more efficient use of the excitation energy from the diode(s) in exciting the laser medium is desirable in every application; any configuration that allows a laser head having a limited size to put out a more powerful laser beam is also useful in any situation where higher power is desirable. Both factors are especially important for lasers that operate in a continuous wave mode, and for lasers used in devices where volume and weight are tightly constrained, such as in satellites.

One such improvement involves the use of reflective surfaces that are coated on or placed adjacent to one or more sides of a laser medium. Reflective surfaces are shown in various items of prior art, including U.S. Pat. No. 4,805,177 also assigned to applicant's assignee. In such devices, a beam of unfocused laser radiation from a laser diode array (or a bank of multiple diode arrays) enters the medium. Most of the energy in that beam of radiation is absorbed by the medium during the "first pass." However, depending on the size of the medium and the wavelength of the unfocused radiation, a portion of the radiation energy will pass entirely through the medium and reach the opposite side (i.e., the side away from the lasing diode pump sources). If there is no reflective surface on that side, the radiation will exit the medium; it will be lost, which reduces efficiency, and it can also impinge on other components of the laser head and contribute to the problem of heating. By providing a reflective surface (such as an electroplated gold or silver surface) adjacent to the medium on the side opposite the diode(s), some of the unfocused laser radiation energy which passes entirely through the medium during the first pass is reflected back into the medium with high efficiency, for a second pass. This reflected energy adds to the population inversion in the medium and hence increases the power and efficiency of the laser.

The reflective surface configuration shown in U.S. Pat. No. 4,805,177 is adapted for use with a laser medium excited by a single row of diode pump sources. By contrast, FIG. 6.59 of Koechner 1988 (cited above) on page 318, shows a side-pumped configuration involving four banks of laser diodes mounted at spaced locations in a hemispherical configuration around a single laser rod. The laser rod is mounted on a heat-conductive mounting device, in a rounded groove that holds the cylindrical medium. The groove is coated over a portion of its surface with a reflective surface as described in the prior paragraph. The configuration shown in that arrangement, however, requires that the banks of laser diodes be placed a substantial distance away from the medium, which in turn requires special lenses to be mounted between the diode pump sources and the medium, to direct the unfocused laser radiation from the diodes toward the medium. Koechner 1988, on page 317, specifically teaches that the use of lenses is advantageous compared to the use of direct pumping in several respects.

Despite that teaching, the Applicants have developed a side-pumped configuration which is superior to the side-pumped configuration shown in Koechner 1988. The configuration of the subject invention is far more compact and lightweight than the devices shown in Koechner 1988 and can generate a beam having substantially more useful output power, per unit of volume occupied by the laser head by mounting the diodes very close to the lasing medium. Such compactness and light weight is highly desirable in numerous applications, including use in satellites and in any other locations that involve miniaturized electronics. In addition, by eliminating the need for lenses, the subject invention provides several additional advantages, including: (1) it eliminates the high cost of lenses which must be precision-ground, carefully polished, and coated with special materials to reduce transmission losses; (2) it eliminates the power losses that occur whenever laser radiation passes through a lens; (3) it eliminates the time, expense, and tedium of carefully mounting and precisely aligning numerous small lenses within the laser head; (4) it increases the durability and longevity of the laser head, rendering it less susceptible to breakage or misalignment due to accidental shocks or mishandling; and (5) it provides a compact construction which enables continuous wave operation with high power outputs.

One object of the subject invention is to provide a side-pumped laser which provides relatively high usable energy output from a highly compact, relatively lightweight laser head.

Another object of this invention is to provide a highly efficient laser head.

Another object of this invention is to increase the efficiency of side-pumped laser heads that operate in a continuous wave mode.

Another object of the invention is to create a side-pumped laser which allows numerous banks of laser diode pump sources to excite a single laser medium, without requiring focusing lenses between the diodes and the medium.

Another object of this invention is to create a side-pumped laser with improved heat control and heat-removal means in a construction having more than one row of laser diode pump sources.

Another object of this invention is to create a side-pumped laser which uses more than one row of laser diodes to excite a laser medium, and which provides maximal utilization of the laser pump radiation by reflecting a substantial portion of the radiation energy which passes entirely through the medium back into the medium.

These and other objects and advantages of the present invention will become apparent after considering the following detailed specification which discloses preferred embodiments in conjunction with the accompanying drawings.

SUMMARY OF THE INVENTION

This invention teaches the construction and operation of a laser device that increases the amount of available laser pump energy and at the same time increases the operating efficiency thereof. The present construction employs unfocused pump energy from several arrays of laser diodes oriented to pump energy into the sides of a laser medium, the arrays being located at an angle relative to each other. The device also has reflective means located opposite from each array of pump sources, in position to reflect a substantial portion of the unfocused laser radiation energy from the pump sources which passes through the medium during the "first pass," returning the reflected radiation energy into the medium for a "second pass." The diode pump sources and the medium are thermally coupled to a heat-removing mounting means that efficiently carry away the heat that is generated. This system provides advantages of economy, efficiency, durability and resistance to vibration and impacts, compact size, light weight, and high power in the output beam. dr

DETAILED DESCRIPTION OF THE PREFERRED EMBODIMENTS

Figure 1:
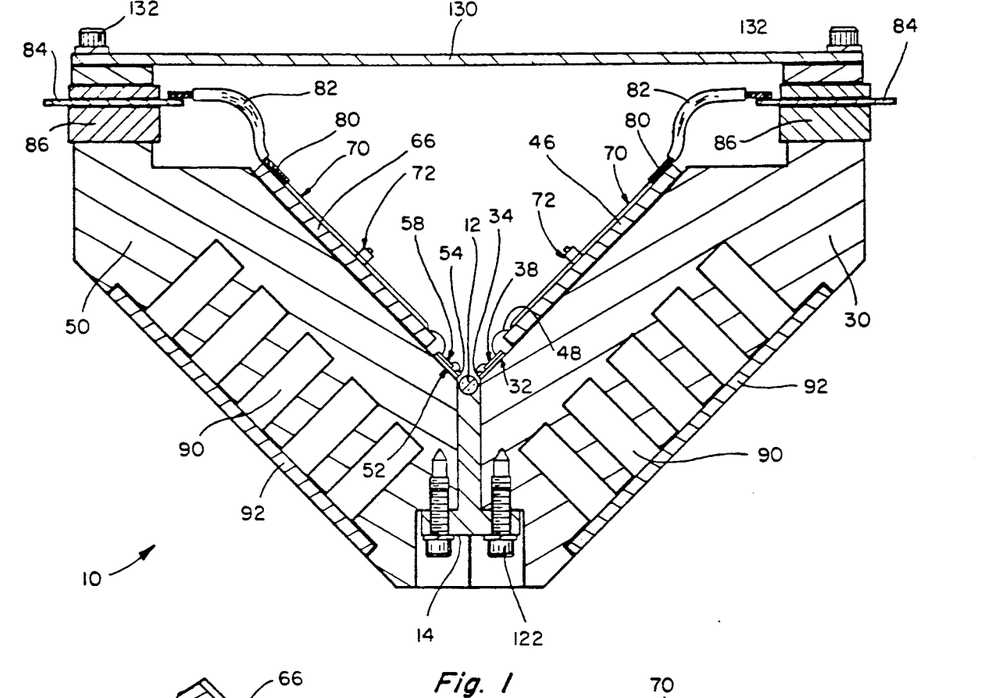
FIG. 1 is an enlarged cross-sectional view of a side-pumped laser device of the subject invention, having spaced rows of laser diode pump sources mounted in a V-shaped configuration.

Referring to the drawings more particularly by reference numbers, assembly 10 in FIG. 1 refers to a side-pumped laser device according to the present invention. The laser beam that emerges from laser device 10 is emitted from an elongated laser medium 12, which is shown in cross-section in FIG. 1 and 2.

The medium preferably consists of a crystal (with a regular and repeated atomic lattice), a glass (without a regular atomic lattice), or any other type of solid medium that functions as a laser gain medium. Since most side-pumped diode lasers use crystals such as neodymium atoms in a crystalline matrix of yttrium-aluminum-garnet (Nd:YAG) or neodymium atoms in a matrix of yttrium-lithium-fluoride (Nd:YLF), the term "crystal" is occasionally used below for convenience, to refer to a preferred embodiment.

The crystal 12 is held stationary by a mount 14 made of a heat-conductive metal such as copper or aluminum. As shown in more detail in FIG. 2, at the top of the mount 14 is a groove 16 which conforms in shape to the crystal and which is shown coated with a reflective layer 18 of material such as electroplated gold, silver, or other such metal. Alternately, the inner surface of groove 16 can be machined and polished to a smooth finish so that the inner surface of the groove 16 can provide the reflective surface. As another alternative, a portion of the outer surface of the crystal itself can be coated with a reflective coating.

Figure 2:
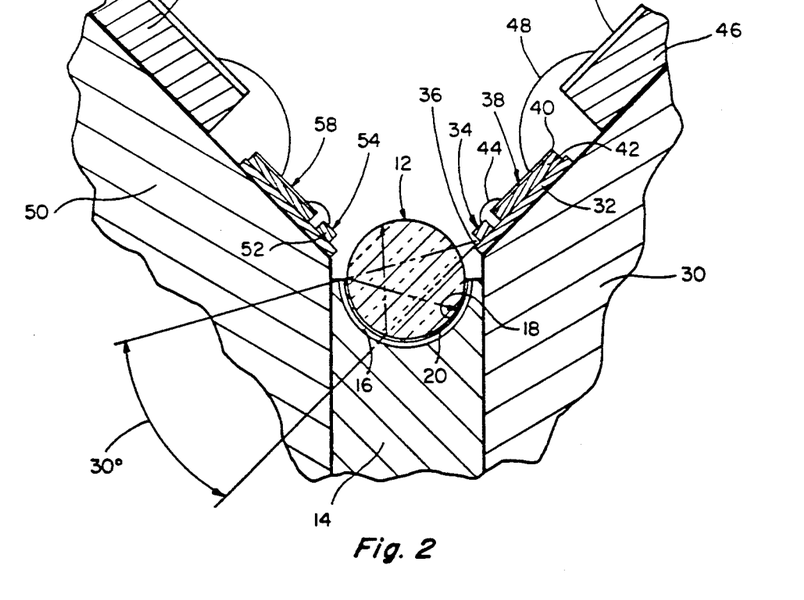
FIG. 2 is a further enlarged fragmentary cross-sectional view of the side-pumped laser device of FIG. 1, showing the lines of travel of the unfocused lasing radiation pattern within a medium having a cylindrical shape.

A suitable adhesive material 20 is provided to bond the crystal 12 to the crystal mount 14. The adhesive selected for such use should be thermally conductive so that heat can be efficiently carried away from the crystal and should remain relatively soft even when cured to minimize strain on the lasing crystal; silicon-based glues are widely used for this purpose. If the adhesive layer 20 is positioned between the crystal and the reflective surface, the adhesive material selected should be transparent to laser radiation at the wavelength emitted by the diode pump sources.

The crystal 12 and the crystal mount 14 in the construction shown in FIGS. 1 and 2 are positioned between two laser diode mounts 30 and 50. The following discussion will describe the arrangement of the laser diode pump sources and other elements mounted on top of the diode mount 30, on one side; the corresponding elements on top of the other diode mount 50 are mounted in a symmetrically identical manner and will not be discussed in detail. Both of the mounts 30 and 50 and all of the components mounted thereon can be identical, to reduce manufacturing costs.

To illustrate the high degree of miniaturization that has been achieved using the configuration of the subject invention, typical sizes of the components used in one preferred embodiment are provided in the discussion that follows. These particular sizes, which balance manufacturing, alignment, testing, and handling ease against the desire for compactness in the assembled unit, are not to be construed as limitations, since the components can be made either larger or smaller to satisfy the goals and constraints of any specific desired use. The components described below were used to assemble a laser device having dimensions of less than 10 cm long, 10 cm wide, and 7 cm tall, that is capable of putting out about 10 watts of power in the output beam, with an efficiency of more than 5%.

The diode mount 30 is made of aluminum, copper, or other heat-conductive material. Numerous diode heat sinks 32, also made of Copper or other heat-conductive metal, are soldered onto the diode mount 30, at the edge of the mount that will be adjacent to the crystal 12 when the unit is assembled. Each diode heat sink 32 is shown rectangular in cross-section and is relatively small, being about 5 mm long and about 1.5 mm wide. After they are polished until one side is extremely smooth, they are about 0.2 mm thick.

A row of diode arrays 34 is soldered on the polished side of each diode heat sink 32. Each of the diode arrays 34 is made of a semiconductor material about 0.15 mm thick, 0.5 mm long, and 1 mm wide. Each diode array emits laser radiation from a plurality of laser stripes when electrical voltage is applied thereacross, and in the prototype described herein, each diode array 34 typically contains four or five laser stripes, each of which functions as a laser diode pump source.

The laser radiation emerges from a very small zone adjacent to where the diode arrays 34 meet the diode heat sink 32. That radiation is not focused and it emerges in a scattered cone. The front end (i.e., the end closest to the laser crystal 12) of each of the diode arrays 34 is mounted about 0.1 mm back from the front edge of the diode heat sink 32; therefore, the exposed surface area 36 of the diode heat sink 32 in front of the diode 34 serves as a reflective surface that constrains the laser radiation emitted by the diode arrays and prevents it from spreading out to undesired areas where it would not impinge the laser crystal. The centerline of the spreading radiation is angled roughly 15° from the surface of diode heat sink 32 and the outer boundary of the spreading radiation is angled about 30° upward from the surface of the diode heat sink 32.

One significant aspect of the subject invention is that the laser medium is "directly" excited by "unfocused" laser radiation from the diode arrays 34. As used herein, "direct" excitation refers to laser energy from the diode arrays 34 which directly impinges the laser medium without having passed through or reflected off any lenses, mirrors, or other focusing means. Similarly, "unfocused" laser radiation refers to radiation from a laser diode pump source which did not pass through a focusing lens or reflect off a focusing mirror before entering a laser gain medium.

Wire bond pad 38 comprises an electrically conductive layer 40 (FIG. 2) on top of a non-conductive layer 42. The conductive layer 40 can be formed by electroplating a layer of metal onto one surface of a non-conductive, heat-resistant material such as ceramic. One end of wire 44 is soldered to the conductive layer 40 on the wire bond pad 38; the other end of the wire 44 is soldered to the layer of gold on top of one of the laser diode arrays 34, so that the wire 44 provides means to apply a voltage across the diode array 34. For ease of manufacturing and handling, wire bond pad 38 is mounted on top of diode heat sink 32.

As shown in FIG. 1, a printed circuit board (PCB) 46 is also mounted on the diode mount 30 but not on the diode heat sink 32. Conductive leads (discussed below and shown in FIG. 6) on the PCB 46 provide an electrical connection to other wires 48. Each conductive lead on the PCB 46 is coupled to a wire bond pad 38 via one of the wires 48.

As mentioned above, the other diode mount 50 is mounted on the opposite side of the medium mount 14 from the mount 30 and has a set of identical elements including a diode heat sink 52, diode arrays 54 which are set back from the front edge of the diode heat sink 52, wire bond pad 58, PCB 66, and wire bond pad 58.

As indicated in FIG. 2, the diode arrays 34 and 54 are positioned to have one of their ends close to the crystal 12, and the arrays are preferably aligned in a manner so that the centerlines of the radiation patterns from diode pump sources (which scatters into a cone) pass through or near the center or axis of the laser crystal 12. When properly positioned, all or nearly all of the radiation from the diode pump sources directly enters the sides of the crystal 12 instead of impinging on any other component. Any photons of radiation energy from the pump sources which passes all the way through crystal 12 will impinge upon a portion of the reflective surface 18, so that a substantial portion of any such unabsorbed radiation energy which reaches the reflective surface 18 will be reflected back through the crystal rather than being lost, thereby increasing the operating efficiency of the laser device.

Figure 3:
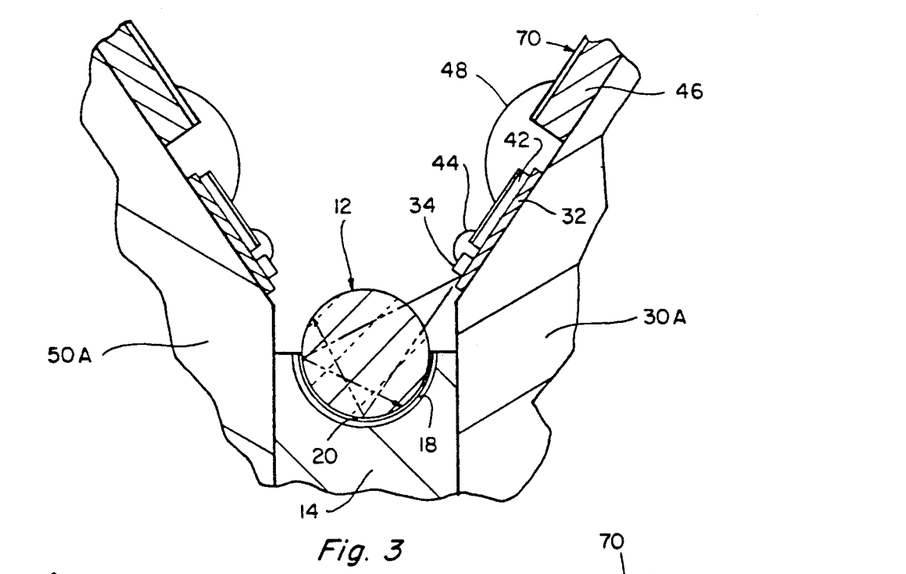
FIG. 3 is an enlarged cross-sectional view of a side-pumped laser device of the invention, showing the lines of travel of the unfocused lasing radiation from two rows of diode pump sources oriented at an acute angle with respect to each other.
Figure 4:
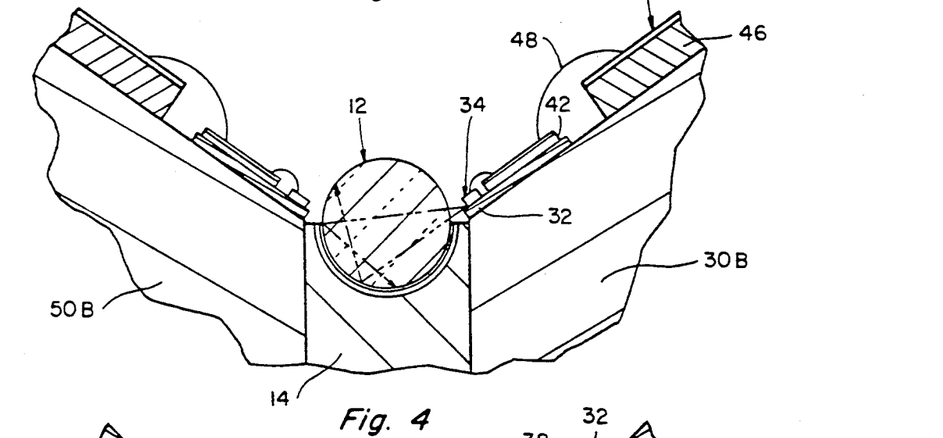
FIG. 4 is an enlarged cross-sectional view of a side-pumped laser device of the invention, showing the lines of travel of the unfocused lasing radiation from two rows of diode pump sources oriented at an obtuse angle with respect to each other.

FIGS. 1 and 2 show a laser construction that has two rows of diode pump sources, for illustrative purposes, oriented perpendicularly with respect to each other. Alternately, the pump sources can be angled at acute angles with respect to each other (as shown in FIG. 3 using diode mounts 30A and 50A) or at obtuse angles (as shown in FIG. 4 using diode mounts 30B and 50B) so long as the other design constraints described herein are satisfied.

Figure 5:
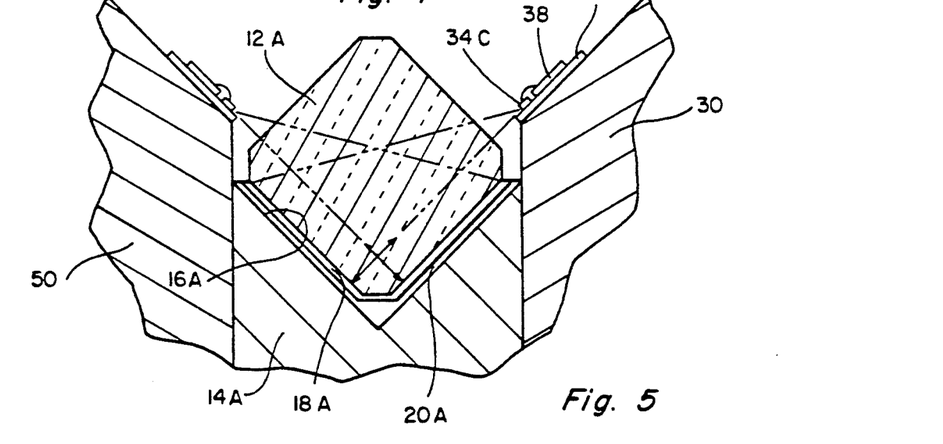
FIG. 5 is a fragmentary cross-sectional view showing a non-circular medium and associated diode pump sources embodying teaching of the present invention.

If desired, the laser medium can have a cross-sectional shape that is non-circular, such as a square, rectangular, or bevelled shape, or a partially circular shape with one or more flat areas or surfaces. FIG. 5 shows the lines of travel of unfocused lasing radiation from diode arrays 34C within a crystal 12A that has a chamfered square shape cross-section shown, mounted in a crystal mount 14A in a V-shaped groove 16A formed by flat reflective surfaces such as surface 18A.

FIG. 5 also illustrates an embodiment wherein the reflective surfaces 18A are coated directly onto portions of the surface of the laser medium 12A. In this embodiment, unfocused laser radiation which reaches the periphery of the crystal 12A is reflected back into the laser medium without first passing through adhesive material 20A.

Each of the printed circuit boards such as boards 46 and 66 in FIG. 2 is formed of a material such as fiberglass or other non-conductive layer and has a pattern of numerous conductive leads such as leads 70 (FIGS. 1 and 6) formed on the top surface thereof. The conductive leads 70 can be arranged to be parallel, and each lead can lead directly from a solder point at one end to a solder point at the opposite end.

Figures 6, 7:
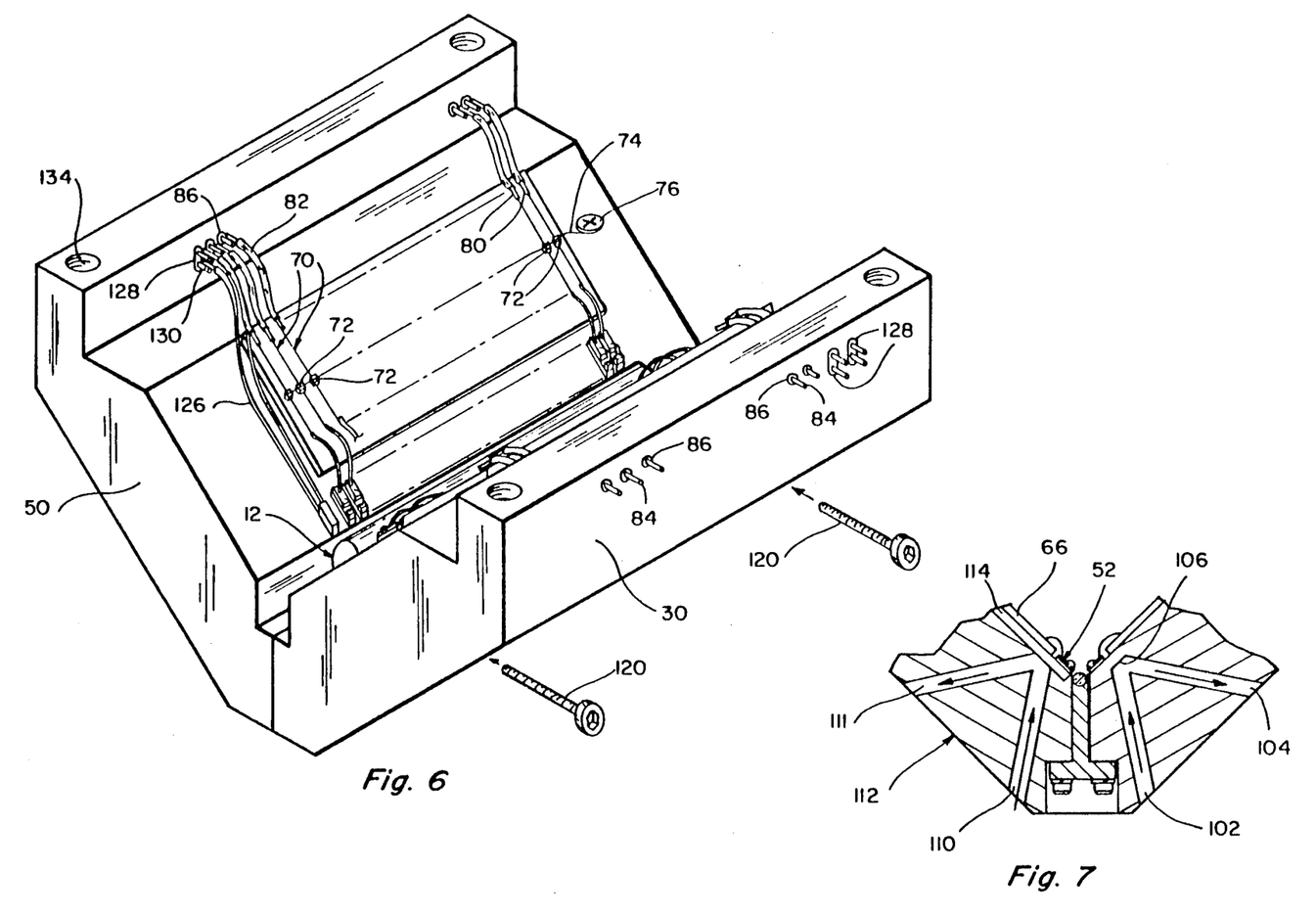
FIG. 6 is a perspective view of a laser device showing the overall configuration of the active elements and the mounting devices in the V-shaped embodiment.
FIG. 7 is an enlarged fragmentary cross-sectional view of a side-pumped laser device showing several forms of passages for a fluid coolant to flow through the mounting means to remove heat from the mounting means and the associated active elements.

Each of the leads 70 can also be coupled to a capacitor 72 if desired. The PCBs can also be provided with holes therethrough to accommodate a conductive lead from each capacitor to be inserted into the PCB for soldering to the leads 70, while a second lead from each capacitor is coupled to a ground wire 74. A single ground wire 74 can be used to couple to all of the capacitors 72, and the ground lead 74 can be connected to a ground screw 76 mounted on diode mount 30 or 50. In this manner, each capacitor is wired in parallel with a single diode array to protect the respective diode arrays against current spikes.

One end of each PCB lead 70 is electrically coupled to a diode array 34 via a wire such as the wire 48, a wire bond pad 38, and a wire 44. The opposite end of each PCB lead 70 is coupled via another wire 80, which is insulated along part of its length by insulation 82, to a connector pin 84 (shown in FIG. 1) which passes through a conduit plug 86 made of a non-conductive material such as a heat-resistant resin, plastic, or rubber. A plurality of conduit plugs 86 with connector pins 84 are mounted on the diode mounts 30 and 50, as shown in FIG. 6. For clarity, only a few diode arrays are shown in FIG. 6. In actual use, the number of diodes of diode arrays that can be mounted along a laser crystal is limited only by the length of the crystal and the width of the diodes. In a working prototype that is sized for mass-manufacturing, twenty diode arrays per side (for a total of forty diode arrays having one hundred and sixty diode stripes) were mounted alongside a Crystal roughly 3 cm in length. The length of the entire laser head, which was longer than the crystal to provide more surface area for cooling, was about 10 cm.

Each connector pin 84 allows current to be supplied to a specific diode array 34 via a wire 80, a PCB lead 70, and a wire bond pad 38. The opposite side of each of the arrays 34 is connected through the diode heat sink 32 to the diode mount 30 which serves as an electrical ground as well as heat sink.

The voltage and current applied to each diode array 34 or 54 can be individually controlled by an electronic control system, based on calibration tests which determine the operating characteristics for each particular diode array. The calibration tests normally are done during the manufacturing and assembly process, and the appropriate current is supplied to each diode based on a setting incorporated into the control system.

If the laser device is of a size and power that requires a water-cooled system, passages 90 can be drilled, cut, molded, machined on or otherwise formed extending through laser diode mounts 30 and 50 (FIG. 1). The passages 90 can be connected to carry water or other cooling fluid, which preferably is pumped through the passages 90 using an external pump and tubing coupled to the laser device in any suitable manner. FIG. 1 shows the passages 90 cut or machined in the diode mount, and closed by attaching a cover plate 92.

If it is desired to position one or more cooling passages closer to the diodes 34 and 54, they can be drilled or molded into the diode mount material such as indicated on the right side of FIG. 7 by connecting passages 102 and 104, which join to form an internal impaction surface 106 where the direction of flow of the coolant is abruptly changed when the coolant moves through the passages. This increases the heat removal adjacent to the pump sources as compared to having straight flow passages.

Alternately, as shown on the left side of FIG. 7, cooling passages 110 and 111 can be cut or machined from the surface of diode mount 112 all the way through the mount so that the connected ends are covered with a cover plate 114. The diode heat sinks 52 can then be mounted on the cover plate 114, with the diodes 54 and wire bond pads 58 mounted on the diode heat sinks 52 in the manner described above.

The order of assembly of the various lasers shown herein is not critical, but the most convenient method for quality control and calibration testing usually involves mounting a set of diode arrays, wire bond pads, PCB's and other electrical elements on a diode mount and placing the entire mount in a testing device which tests each diode array individually against a test crystal to determine the optimal current for that particular array. After each row of diode arrays has been assembled, tested and calibrated, the rows or sets of diode arrays are assembled and bolted together using screws or other suitable attachment means. The laser crystal 12, mounted on the crystal mount 14, is inserted into the slot between the two diode mounts 30 and 50 and is held in place by screws such as screws 122 as shown in FIG. 1. Four such screws 122 (two adjacent to each end of the crystal mount) are usually sufficient.

If desired, a gap can be provided between the walls of the crystal mount 14 and the diode mounts 30 and 50 to allow the crystal mount 14 to be positioned after the diode mounts have been fixed in position. Alternately, to increase heat transfer between the crystal mount 14 and the diode mounts 30 and 50 (which may be desirable if coolant channels pass through the diode mounts close to the crystal as shown in FIG. 7), the crystal mount 14 can be sized to provide a tight fit and good contact between the members 14, 30 and 50. If this is done the crystal mount can be slid into position before the end screws 122 are tightened so that when the end screws 122 are tightened, the mounts 30 and 50 will press firmly against the crystal mount 14.

Another alternative is to place insulation between the crystal mount 14 and the diode mounts 30 and 50. If this is done it will enable the crystal to be operated at a temperature that is different from the operating temperature of the diode pump sources.

If desired, one or more electronic temperature sensors 124 can be placed on each of the diode mounts, as shown in FIG. 6. The sensors 124 can be used to provide continuous current flows that are based on the various temperatures in the respective laser heads. The signals from the temperature sensors 124 are transferred out of the laser head via leads 126, which pass through selected insulations 128 that can also serve to support conduction pins 130, as shown in FIG. 6. The temperature-signals can be used as inputs to an electronic control circuit or microprocessor that performs various functions such as varying the flow rate of flow of cooling fluid through the diode mounts, controlling the voltages supplied to the respective laser diodes, or activating a shut-off switch should the temperatures approach a dangerously high level.

The entire laser assembly can also be enclosed in a housing to prevent dust and other foreign substances from affecting it, and if desired to generate a vacuum within and around the laser assembly. This can also be accomplished by means of a cover or closure plate 130 secured to the diode mounts 30 and 50 by cover plate screws 132 as shown in FIG. 1. If a sealed closure is used to seal around the elements of the laser a suitable gasket (not shown) may be provided.

Figure 8:
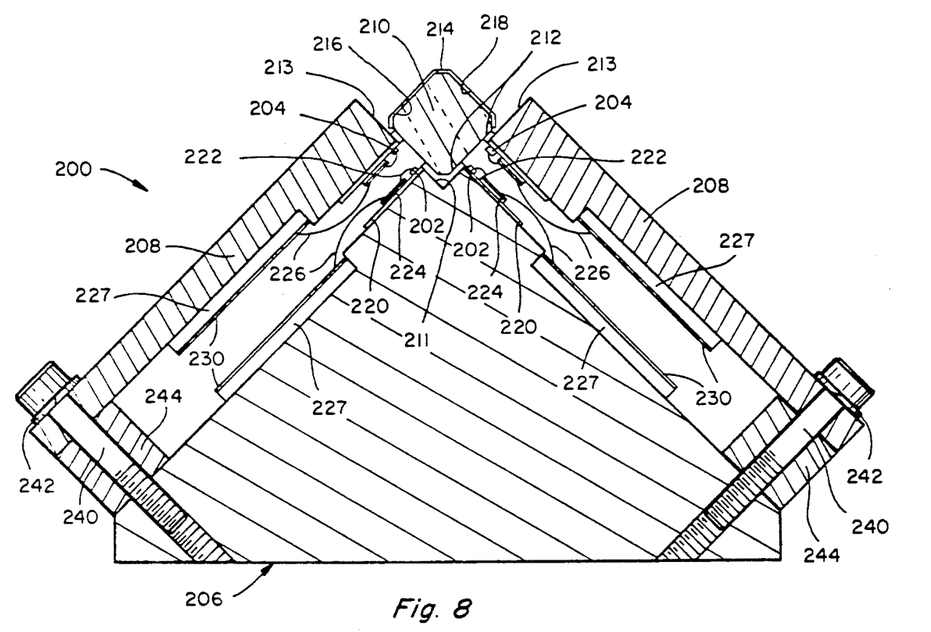
FIG. 8 is an enlarged fragmentary cross-sectional view of a laser device showing four rows of diode pump sources oriented in a pyramidal configuration.
Figure 9:
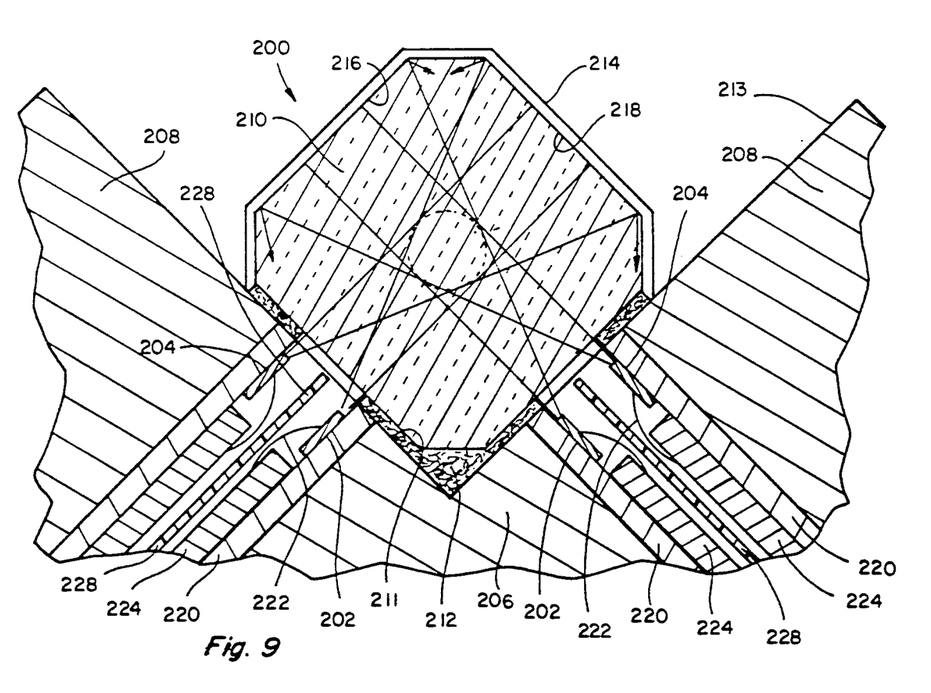
FIG. 9 is further enlarged fragmentary cross-sectional view of the of FIG. 8, showing the lines of travel of the unfocused laser radiation inside the laser medium.
Figures 10, 12:
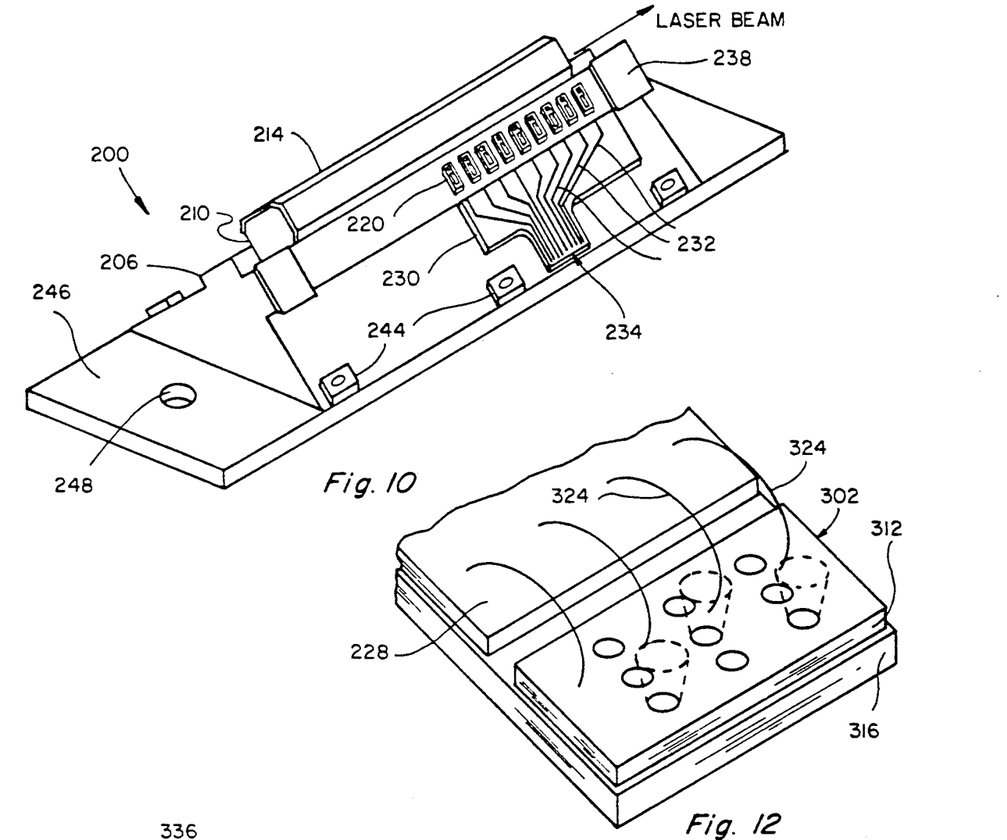
FIG. 10 is a perspective view of the lower laser mount of the device of FIG. 8, showing the placement of one of the printed circuit boards and the corresponding diode pump sources.
FIG. 12 is an enlarged perspective view of one of the surface emitting pump sources shown in FIG. 11.

In an alternate embodiment of the invention shown in FIGS. 8-10, the diode pump sources are mounted in a laser assembly 200, referred to as a pyramidal configuration This embodiments has two lower rows of diode arrays 202 mounted on perpendicular faces of a lower diode mount 206 and two upper rows of diode arrays 204 mounted on perpendicular faces of two upper diode mounts 208. Unfocused laser radiation emitted by all four rows of diodes 202 and 204 enters perpendicular faces of laser medium 210, which is substantially square in cross section and is mounted in a groove 211 in the lower diode mount 206. An adhesive material 212 may be used to make this connection. The medium may also be adhesively or otherwise attached to or moved against end surfaces 213 on the mounts 208.

A reflective coating or layer 214 is shown applied to surfaces 216 and 218 of laser medium 210 opposite from the respective rows of laser diode arrays 202 and 204.

Each diode array in the pyramidal assembly 200 is assembled and operated in the manner described above in relation to the V-shaped configuration. As shown in more detail in FIG. 9, each lower row of diode arrays 202 is mounted on a diode heat sink 220 and each diode array 202 is coupled via a wire 222 to a wire bond pad 224 which also is mounted on a diode heat sink 220. The conductive layer on top of each wire bond pad 224 is coupled via wire 226 (FIG. 8) to a printed circuit board 230 which is on a ceramic member 227 mounted on a face of the diode mount 206, preferably in an inset region as described below. Other connections are made to the source of energy for the assembly attached.

The upper diode mounts 208 are attached to the lower diode mount 206 using means such as bolts 240, lock washers 242 and spacer elements 244, which can be cast or machined as part of the lower or upper diode mounts, or which can be separate elements as shown.

FIG. 9 shows the shape of the envelopes of the unfocused laser radiation from the diode pump sources 202 and 204 as it passes through the laser medium 210 from their different directions. Most of the pump energy from the rows of diode arrays 202 and 204 is directed at and concentrated at or near the center of the medium along its length. However, a substantial portion of radiation energy from the pump sources passes entirely through the laser medium 210 during the first pass and reaches and is refleccted back by the reflective material 214 adjacent medium surfaces 216 and 218, thereby increasing the absorption efficiency of the laser device.

FIG. 9 also shows the use of optional insulated barriers 228 placed between adjacent upper and lower rows of lower diode arrays 202 and 204. The barriers 228 prevent the possibility of adjacent upper and lower connections wires 222 and 226 from contacting each other and causing electrical short-circuits.

FIG. 10 is a perspective view selectively enlarged of one side of the pyramidal device 200, with the upper diode mounts 208 and diode arrays 204 mounted thereon removed to reveal the shape of the lower diode mount 206 and the location and configuration of one of the printed circuit boards 230. As shown, the PCB 230 has a non-symmetric shape, and the conductive leads 232 thereon are shown in a fanned out configuration to facilitate their connections to the respective diode arrays and to the outside circuitry.

FIG. 10 also shows a number of the diode arrays in a highly enlarged form for clarity. In an actual device 19 working diode arrays (each about 1.5 mm wide) were coupled to each of eight PCB's, for a total of 152 diode arrays mounted alongside one face of the crystal 210, and the crystal was approximately 63 mm (2.5 inches) long. If each diode array contained four laser stripes, the assembly of 152 diode arrays would contain 608 individual laser diodes. That assembly emitted a laser beam that carried about 10 millijoules of energy in a 30 nanosecond pulse, after passing through a Q-switch (to increase the peak power of each pulse) which Q-switch consumed about 40% of the power of the focused beam emitted by the laser medium. The entire system operated at an efficiency of about 5% and the efficiency of the unit before the focused beam entered the Q-switch was close to 10%.

The lower diode mount 206 in the pyramidal assembly 200 can be provided with elongated passages for a fluid coolant, comparable to the passages described in relation to the V-shaped assembly. The upper diode mounts 208 can also be provided with coolant passages or they can be coupled to other active cooling devices such as to thermoelectric coolers, or to heat sinks with exposed fins or to both. The amount of thermally conducting surface contact between the upper diode mounts 208 and the lower diode mount 206 can also be increased. This can be done by providing spacer platforms 238 at each end of the diode mounts as shown.

The V-shaped assembly as well as the pyramidal assembly can also be made as part of a larger assembly that can include other components, such as a Q-switch to generate pulses with high peak power, frequency doubling means such as a potassium-titanyl-phosphate (KTP) crystal, a polarizing device, or a system heat sink. A mounting plate 246 fitted with bolt holes 248 for mounting the assembly can also be provided and can be made to be part of the heat sink system.

Figure 11:
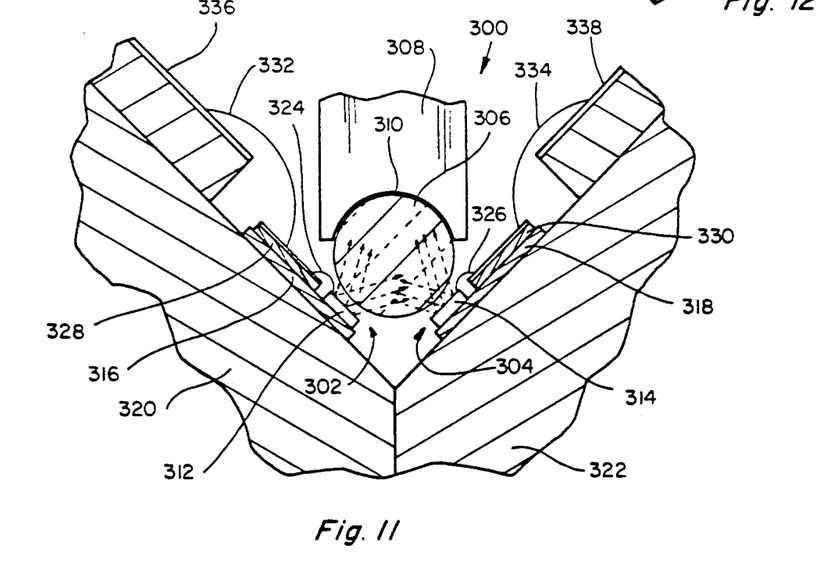
FIG. 11 is a cross-sectional view showing a side-pumped laser device having surface-emitting diodes for use in the laser pump sources.

The subject invention can also use surface-emitting diodes as the laser pump source. Such diodes are described in, e.g., W. Streifer et al, *IEEE Journal of Quantum Electronics* 24(6): 883 (1988). FIGS. 11 and 12 show fragments of such a side-pumped laser 300, wherein first and second rows 302 and 304 of surface-emitting diodes are angularly oriented with respect to each other when viewed along the axis of an elongated gain medium 306. Cones of unfocused laser radiation from both rows 302 and 304 of surface-emitting diodes impinge at spaced locations on the medium 306. As described above, the gain medium 306 is attached to a heat-conductive mount 308, and a portion of the gain medium 306 is coated or otherwise provided with reflective means 310 having portions in opposed relation to the rows of diodes 302 and 304. The surface-emitting diodes 302 and 304 are mounted on the mounting members in the same manner as the diodes discussed above in connection with the other embodiments. The difference being that with the surface-emitting diodes 302 and 304 the output energy comes out from the top surface of the diode chips instead of from the ends. As shown in FIG. 11 the locations of the surface emitting diodes 302 and 304 are mounted on respective diode chips 312 and 314 which in turn are mounted on diode heat sinks 316 and 318 which are attached to suitable members or supports 320 and 322. The diode chips 312 and 314 are connected by wires 324 and 326 to respective wire bond pads 328 and 330 which in turn are connected by other leads or wires 332 and 334 to respective printed circuit boards 336 and 338.

In FIG. 12 the construction and connections of a typical diode chip such as chip 302 are shown in perspective together with the radiation pattern from some of the surface emitting diodes. Except for the fact that the construction shown in FIGS. 11 and 12 employs surface-emitting diodes instead of end emitting diodes the construction and operation of the device is substantially the same as described above in connection with the other embodiments.

The present invention fulfills all the objects and advantages set forth above. It will be apparent to those skilled in the art, however, that various changes, modifications, and other uses and applications which do not depart from the spirit and scope of the invention are possible. All such variations and equivalents are deemed to be covered by the invention, which is limited only by the claims that follow.

I claim:

1. A laser device including
   an elongated laser medium capable when excited of having a lasing condition established therein, said medium having an axis,
   heat conductive mounting means in thermal conductive relationship to the medium,
   other supporting means positioned adjacent to the mounting means constructed of a thermal conductive material,
   first and second sets of laser diode pump sources mounted respectively on the other supporting means and in thermal conductive relation thereto, each set of laser diode pump sources including a plurality of laser diodes arranged in a line which is substantially parallel to the axis of the medium, thereby defining a first plane shared by the axis of the medium and the first set of pump sources, and a second plane shared by the axis of the medium and the second set of pump sources, said first plane being angularly oriented relative to said second plane, means for energizing the laser diodes in the pump sources to produce a lasing condition therein, the diodes being positioned closely adjacent to the medium and oriented so that when energized to lase, the output lasing energy from the diode pump sources will be directed uninterruptedly to and through the medium as unfocused energy, and means adjacent to the medium in opposed relationship respectively with the first and second sets of laser diode pump sources for reflecting at least some of the energy from the sources that passes through the medium back through the medium to increase the absorption efficiency thereof.

2. The laser device of claim 1 wherein the first and second planes are arranged at an acute angle relative to each other.

3. The laser device of claim 1 wherein the first and second planes are arranged at a right angle relative to each other.

4. The laser device of claim 1 wherein the first and second planes are arranged at a obtuse angle relative to each other.

5. The laser device of claim 1 wherein the medium is an elongated rod-shaped member comprising neodymium atoms in a crystalline matrix.

6. The laser device of claim 1 wherein the first and second sets of laser diode pump sources each include a plurality of parallel elongated laser diodes.

7. The laser device of claim 1 comprising a plurality of surface-emitting laser diodes.

8. The laser device of claim 1 wherein the mounting means for the medium and the other supporting means for the laser diode pump sources are in heat conductive relation to each other.

9. The laser device of claim 1 including passage means in the other supporting means for the circulation of coolant.

10. The laser device of claim 9 wherein the passage means has at least one portion that is angularly related relative to the remainder of the passage means, thereby causing coolant passing through the passage means to impinge upon an internal surface of the passage means.

11. The laser device of claim 1 wherein said first set of laser diode pump sources includes two spaced rows of laser diode pump sources, positioned and oriented so that when energized to lase, the output lasing energy from both of the two spaced rows of laser diode pump sources will be directed uninterruptedly at and through the medium.

12. The laser device of claim 11 including a layer of electrical insulating material positioned between the two spaced rows of laser diode pump sources and the electrical connections thereto.

13. The laser device of claim 11 wherein said second set of laser diode pump sources includes two spaced rows of laser diode pump sources including electrical connections thereto, thereby providing at least four rows of laser diode pump sources, all of which are positioned and oriented so that the output lasing energy from all of the laser diode pump sources is directed uninterruptedly at and through the medium.

14. The laser device of claim 1 wherein the laser medium is a cylindrically shaped rod.

15. The laser device of claim 1 wherein the laser medium is a rod-shaped member having a pair of angularly related flat faces formed thereon, said flat faces being positioned on the opposite sides of the rod from the respective first and second sets of laser diode pump sources, the energy-reflecting means being located adjacent to the said flat faces.

16. The laser device of claim 15 wherein the energy reflecting means are located on the flat rod faces.

17. A laser device comprising, an elongated laser medium having a side wall and an axis and capable when excited of having a lasing condition established therein, heat sink means in thermal conductive relationship supporting the medium, a pair of angularly related pump sources mounted on the heat sink in closely spaced relationship to the medium, each source of said pair including a plurality of coplanar elongated laser diodes arranged in a row, the plane of one source being angularly related relative to the plane of the other source of the pair, one end of each diode in each row being in closely spaced relationship to the side wall of the medium, means operatively connected to the diodes in each row to excite said diodes to establish a lasing condition therein that produces output energy directed longitudinally therein, the output energy of each diode being directed as unfocused energy at and through the medium, some of the output energy of each diode being absorbed by the medium and contributing to establishing a population inversion therein and some of the output energy of the diodes passing through the medium, and reflective means positioned adjacent to the medium in opposed relationship to the respective rows of laser diodes in positions to reflect at least some of the output energy from the sources impinging thereon back through the medium to increase the amount of output energy from the pump sources that is absorbed and contributes to the population inversion in the medium.

18. The laser device of claim 17 wherein the medium is an elongated rod-shaped member comprising neodymium atoms in a crystalline matrix.

19. The laser device of claim 17 wherein the first and second sets of laser diode pump sources each include a plurality of parallel elongated laser diodes.

20. The laser device of claim 17 comprising a plurality of surface-emitting laser diodes.

21. The laser device of claim 17 wherein the mounting means for the medium and the other supporting means for the laser diode pump sources are in heat conductive relation to each other.

22. The laser device of claim 17 including passage means for the circulation of coolant through the other supporting means for the laser diode pump sources.

23. The laser device of claim 22 wherein the passage means has at least one portion that is angularly related relative to the remainder of the passage means, thereby causing coolant passing through the passage means to impinge upon an internal surface of the passage means.

24. The laser device of claim 17 wherein said first set of laser diode pump sources includes two spaced rows of laser diode pump sources, positioned and oriented so that when energized to lase, the output lasing energy from both of the two spaced rows of laser diode pump sources will be directed uninterruptedly at and through the medium.

25. The laser device of claim 24 including a layer of electrical insulating material positioned between the two spaced rows of laser diode pump sources.

26. The laser device of claim 24 wherein said second set of laser diode pump sources includes two spaced rows of laser diode pump sources, thereby providing at least four rows of laser diode pump sources, all of which are positioned and oriented so that the output lasing energy from all of the laser diode pump sources will be directed uninterruptedly at and through the medium.

27. The laser device of claim 17 wherein the laser medium is a rod-shaped member having a pair of angularly related flat faces formed thereon, said flat faces being positioned on the opposite sides of the rod from the respective first and second sets of laser diode pump sources, the energy-reflecting means being located adjacent to the said flat faces.

28. A laser device comprising,
an elongated laser medium having a side wall and axis and capable when stimulated of having a population inversion established therein and an accompanying lasing condition oriented substantially parallel to the axis thereof,
heat sink means in thermal conductive relationship supporting the medium,
a pair of pump sources mounted on the heat sink means in closely spaced relationship to the medium, each source of said pair including a plurality of aligned semiconductor laser diodes capable when lasing of emitting a cone-shaped output pattern of lasing energy, all of said semiconductor laser diodes being oriented so that the cone-shaped output energy is directed at the medium, the plane through the axis of the medium of one source of said pair of sources being angularly related to the plane through the axis and the other source of said pair of sources,
means operatively connected to the semiconductor laser diodes to establish a lasing condition therein the output energy of which is directed as unfocused energy at and through the medium, some of the output energy of said semiconductor laser diodes being absorbed by the medium and contributing to establishing a population inversion therein and some of the energy passing through the medium, and
reflective means positioned adjacent to the medium in opposed relationship to the respective rows of semiconductor laser diodes in positions to reflect at least some of the output energy from the sources impinging thereon back through the medium to increase the amount of output energy of the pump sources that is absorbed and contributes to the population inversion in the medium.

29. The laser device of claim 28 wherein the medium is an elongated rod-shaped member comprising neodymium atoms in a crystalline matrix.

30. The laser device of claim 28 wherein the first and second sets of laser diode pump sources each include a plurality of parallel elongated laser diodes.

31. The laser device of claim 28 comprising a plurality of surface-emitting laser diodes.

32. The laser device of claim 28 wherein the mounting means for the medium and the other supporting means for the laser diode pump sources are in heat conductive relation to each other.

33. The laser device of claim 28 including passage means for the circulation of coolant through the other supporting means for the laser diode pump sources.

34. The laser device of claim 33 wherein the passage means has at least one portion that is angularly related relative to the remainder of the passage means, thereby causing coolant passing through the passage means to impinge upon an internal surface of the passage means.

35. The laser device of claim 28 wherein said first set of laser diode pump sources includes two spaced rows of laser diode pump sources, positioned and oriented so that when energized to lase, the output lasing energy from both of the two spaced rows of laser diode pump sources will be directed uninterruptedly at and through the medium.

36. The laser device of claim 35 including a layer of electrical insulating material positioned between the two spaced rows of laser diode pump sources.

37. The laser device of claim 35 wherein said second set of laser diode pump sources includes two spaced rows of laser diode pump sources, thereby providing at least four rows of laser diode pump sources, all of which are positioned and oriented so that the output lasing energy from all of the laser diode pump sources will be directed uninterruptedly at and through the medium.

38. The laser device of claim 28 wherein the laser medium is a rod-shaped member having a pair of angularly related flat faces formed thereon, said flat faces being positioned on the opposite sides of the rod from the respective first and second sets of laser diode pump sources, the energy-reflecting means being located adjacent to the said flat faces.

39. A side-pumped laser device comprising:
an elongated laser medium having an axis and capable when excited of establishing a lasing condition therein;
means for mounting said laser medium;
a first row and a second row of laser diode pump sources, each laser diode in each row being capable when excited of emitting laser radiation,
means for mounting the rows of laser diodes adjacent to the laser medium in position so that uninterrupted optical communication is established therebetween and sufficiently close to said laser medium so that substantially all of the laser radiation emitted by the laser diode pump sources impinges on the laser medium, the laser diode pump sources and the mounting means therefor being mounted so that laser radiation from the first row of laser diodes is angularly oriented relative to the laser radiation from the second row of laser diodes, and
respective reflective means positioned adjacent to said laser medium on the oposite sides thereof and in opposed relation to each row of laser diode pump sources in position to reflect back through the laser medium at least some of the laser radiation that passes through the laser medium without being absorbed thereby.

40. The laser device of claim 39 wherein the medium is an elongated rod-shaped member comprising neodymium atoms in a crystalline matrix.

41. The laser device of claim 39 wherein the first and second sets of laser diode pump sources each include a plurality of parallel elongated laser diodes.

42. The laser device of claim 39 comprising a plurality of surface-emitting laser diodes.

43. The laser device of claim 39 wherein the mounting means for the medium and the other supporting means for the laser diode pump sources are in heat conductive relation to each other.

44. The laser device of claim 39 including passage means for the circulation of coolant through the other supporting means for the laser diode pump sources.

45. The laser device of claim 44 wherein the passage means has at least one portion that is angularly related relative to the remainder of the passage means, thereby causing coolant passing through the passage means to impinge upon an internal surface of the passage means.

46. The laser device of claim 39 wherein said first set of laser diode pump sources includes two spaced rows of laser diode pump sources, positioned and oriented so that when energized to lase, the output lasing energy from both of the two spaced rows of laser diode pump sources will be directed uninterruptedly at and through the medium.

47. The laser device of claim 46 including a layer of electrical insulating material positioned between the two spaced rows of laser diode pump sources.

48. The laser device of claim 46 wherein said second set of laser diode pump sources includes two spaced rows of laser diode pump sources, thereby providing at least four rows of laser diode pump sources, all of which are positioned and oriented so that the output lasing energy from all of the laser diode pump sources will be directed uninterruptedly at and through the medium.

49. The laser device of claim 39 wherein the laser medium is a rod-shaped member having a pair of angularly related flat faces formed thereon, said flat faces being positioned on the opposite sides of the rod from the respective first and second sets of laser diode pump sources, the energy-reflecting means being located adjacent to the said flat faces.

* * * * *

UNITED STATES PATENT AND TRADEMARK OFFICE
CERTIFICATE OF CORRECTION

PATENT NO. : 5,140,607
DATED : August 18, 1992
INVENTOR(S) : Richard A. Paiva

It is certified that error appears in the above—identified patent and that said Letters Patent is hereby corrected as shown below:

In the Abstract, item [57], line 6, after "at", insert --an--.

Column 1, line 17, after "lenses", insert --.--.

Column 1, line 42, after "outputs", insert --.--.

Column 1, line 47, after "reasons", insert --.--.

Column 5, line 3, delete --dr--.

Column 5, line 39, after "is", insert --a--.

Column 5, line 40, after the first "the", insert --device--.

Column 10, line 41, after "configuration" insert --.--.

Signed and Sealed this

Twenty-fourth Day of August, 1993

Attest:

BRUCE LEHMAN

Attesting Officer     Commissioner of Patents and Trademarks